United States Patent

Hsieh et al.

[11] Patent Number: 6,143,461
[45] Date of Patent: Nov. 7, 2000

[54] PROCESS FOR OBTAINING A COLOR IMAGE WITH IMPROVED RESOLUTION

[75] Inventors: Shane Hsieh, Bridgewater; Rusty Koenigkramer, Neshanic Station, both of N.J.; David Siegfried, Langhorne, Pa.; Richard Shadrach, Belle Mead; Wojciech Wilczak, Jersey City, both of N.J.; Richard Zagroba, Redmond, Wash.

[73] Assignee: Agfa Corporation, Ridgefield Park, N.J.

[21] Appl. No.: 09/396,901

[22] Filed: Sep. 15, 1999

[51] Int. Cl.⁷ .................. G03C 8/50; G03F 7/34
[52] U.S. Cl. ............. 430/256; 430/253; 430/259; 430/260; 430/261
[58] Field of Search .................. 430/253, 254, 430/256, 259, 260, 261

[56] References Cited

U.S. PATENT DOCUMENTS

| | | | |
|---|---|---|---|
| 5,300,399 | 4/1994 | Wilczak | 430/253 |
| 5,686,221 | 11/1997 | Koletar | 430/254 |
| 5,738,970 | 4/1998 | Hsieh et al. | 430/259 |

*Primary Examiner*—Janet Baxter
*Assistant Examiner*—Yvette M. Clarke
*Attorney, Agent, or Firm*—Roberts & Mercanti, LLP

[57] ABSTRACT

The present invention relates to a method for negative a positive image, using a negative acting color proofing element comprising, sequentially, a strippable cover sheet; a crosslinked layer containing a polymer having phenolic groups; a color layer, containing a colorant, a polymeric binder, a polymerizable monomer and, optionally, a photoinitiator; a photoadhering layer containing polymerizable groups, and, optionally, a free radical photoinitiator; and a optional thermoplastic adhesive layer. At least one of the color layer and the photoadhering layer containing the photoinitiator. The element is first exposed to actinic radiation and then laminated to a receiver sheet. The composite peeled apart to thereby form a colored negative image on the receiver sheet.

19 Claims, No Drawings

PROCESS FOR OBTAINING A COLOR IMAGE WITH IMPROVED RESOLUTION

BACKGROUND OF THE INVENTION

1. Field of the Invention

The present invention relates to color proofing films. More particularly, the present invention pertains to a negative working, peel-apart photosensitive element capable of producing negative images upon imagewise exposure to actinic radiation and subsequent peel-apart development. Such color proofing films produce multicolored negative images on a receiver sheet by successive imagewise exposures to actinic radiation and peel developments.

2. Description of the Prior Art

In the field of lithographic printing, it is desirable to produce a multicolor proof to assist in correcting a set of color separation films prior to using them to produce metal based lithographic printing plates. The proof should reproduce the color quality that will ultimately be obtained during the printing process. The proof must be a consistent duplicate of the desired halftone image. Visual examination of a color proof should show the color rendition to be expected from a press printing using the color separations, and any defects on the separations which might need to be altered before making the printing plates.

It is known in the art to produce color proofs for multicolor printing by using a printing press or proof press. However, this procedure requires that all of the actual printing steps be performed including making expensive metal printing plates. As a result, this conventional method of color proofing is costly and time consuming.

Photoimaging processes can also be used to produce a color proof. There are two general types of photoimaging methods, namely the overlay type and the single sheet type. In the overlay type of color proofing method, an independent transparent plastic support is used for producing an image of each color separation film by applying a photosensitive solution of the corresponding color. A series of such supports carrying images of the corresponding colors are then superimposed upon each other over a white sheet to produce a color proofing composite. The primary advantage of the overlay method is that proofs can be made quickly and can serve as a progressive proof by combining any two or three colors in register. However, this type of color proofing method has the disadvantage that the superimposed plastic supports tend to darken the color proofing sheet. As a result, the impression of the color proofing composite thus prepared is vastly different from that of copies actually obtained with conventional printing presses and with proof presses. Examples of such overlay approaches are contained in U.S. Pat. Nos. 3,136,637; 3,211,553; and 3,326,682.

In the single sheet type of color proofing method, a color proofing sheet is prepared by successively producing images of different colors from different color separation films on a single receiver sheet. This can be accomplished by sequentially applying colorants or colored, photosensitive layers to a single opaque support. This method more closely resembles the actual printing process and eliminates the color distortion inherent in the overlay system. Examples of such single sheet approaches are contained in U.S. Pat. Nos. 3,574,049; 3,671,236; 4,260,673; 4,366,223; 4,650,738; 4,656,114; and 4,659,642.

Peel apart color proofing systems are also well known. U.S. Pat. Nos. 4,963,462; 5,049,476; 4,910,120 and 5,108,868 disclose peel developable, single sheet color proofing systems. U.S. Pat. No. 4,489,154, discloses a process which produces a single layer color proof by peel development. The photosensitive material comprises a strippable cover sheet; a colored photoadherent layer; a nonphotosensitive organic contiguous layer; and a sheet support. The material is exposed and peel developed. The positive or negative image is transferred to a receiver base. A fresh layer of adhesive must be applied to the receptor for each subsequent transfer.

It has been a problem in the art to produce color proofing images having a high degree of resolution. In this regard, U.S. Pat. No. 5,300,399 discloses one type of peel apart color proofing system to produce a negative-acting color proofing film. This element sequentially comprises a strippable cover sheet which is transparent to actinic radiation; a crosslinked release layer; a color layer; a photoadhering layer; a thermoplastic adhesive layer; and a receiver sheet. At least one of the color layer and the photoadhering layer contains a photoinitiator. A single sheet, negative working color proofing film having good image quality with high resolution is produced when exposed through the strippable cover sheet. The cover sheet is subsequently peeled away, removing the unexposed areas of the color layer and transferring the exposed areas of the color layer to the receiver sheet.

U.S. Pat. No. 5,686,221 teaches another proof-making process which requires contacting a photomask with the clear adhesive layer of the first, unlaminated, color film; exposing the film imagewise to actinic light through a photomask and the adhesive layer; laminating the exposed film to a temporary receiver with the adhesive layer facing the receiver; peeling away the clear PET support from the temporary receiver, with the exposed areas of the color layer remaining attached to the temporary receiver, optionally repeating steps 1–4 for another color film in register; laminating the temporary receiver bearing a multicolor image on it to a permanent receiver and peeling them apart, thus transferring the multicolor image to the permanent receiver. It has now been unexpectedly found that images with improved resolution compared to those produced by U.S. Pat. No. 5,300,399 can be obtained via a process different and simpler than the one taught by U.S. Pat. No. 5,686,221.

The method of this invention improves on the resolution obtainable by U.S. Pat. No. 5,300,399 by first imagewise exposing the unlaminated photosensitive element and then laminating it to its receiver and peel developing. While a typical resolution obtained by U.S. Pat. No. 5,300,399 is 10–95% dots on a 150 l/inch screen ruling, a typical resolution obtained by this invention is 2–97% dots on a 150 l/inch screen ruling. The inventive method improves on U.S. Pat. No. 5,686,221 by eliminating the need for a temporary receiver and extra lamination step.

SUMMARY OF THE INVENTION

The invention provides a method for producing a negative image which comprises:

(A) providing a photosensitive element which comprises, in order from top to bottom
- (i) a strippable, transparent cover sheet;
- (ii) a crosslinked layer, which comprises a polymer having phenolic groups;
- (iii) a color layer, which comprises an organic binder, a photopolymerizable monomer, a colorant, and optionally, a photoinitiator, wherein the binder is present in sufficient amount to bind the color layer components into a uniform film, wherein the optional photoinitiator, when present, is present in sufficient amount to initiate polymerization of the photopolymerizable monomer, wherein the photopolymerizable monomer is present in sufficient amount to provide image differentiation when the element is imagewise exposed to actinic radiation and wherein the colorant is present in an amount sufficient to uniformly color the color layer;

(iv) a photoadhering layer, which comprises a photocrosslinkable polymer having ethylenically unsaturated, photocrosslinkable groups and a molecular weight greater than about 3,000, a photopolymerizable monomer having at least one ethylenically unsaturated group, and an optional photoinitiator, wherein the optional photoinitiator, when present, is present in sufficient amount to initiate polymerization of the photopolymerizable monomer and the crosslinking of the photocrosslinkable polymer and wherein at least one of either the color layer or the photoadhering layer contains a photoinitiator; and (v) an optional thermoplastic adhesive layer;

(B) imagewise exposing the color layer and the photoadhering layer to actinic radiation, thereby producing a latent negative image;

(C) thereafter laminating the photosensitive element via the photoadhering layer and optional thermoplastic adhesive layer to a receiver sheet;

(D) peeling apart the receiver sheet and the transparent cover sheet with the crosslinked phenolic layer, retaining unexposed areas of the color layer on the crosslinked phenolic layer of the cover sheet, and transferring the exposed areas of the color layer onto the receiver sheet via the photoadhering layer and optional adhesive layer, to thereby form a colored negative image on the receiver sheet; and (E) optionally repeating steps (A) through (D) at least once wherein a latent negative image from another photosensitive element having at least one different colorant is transferred onto the negative image previously produced on the receiver sheet.

DETAILED DESCRIPTION OF THE PREFERRED EMBODIMENT

In the practice of the present invention, a photosensitive element is prepared by forming layers on a transparent cover sheet which are, sequentially, a crosslinked phenolic layer, a color layer, a photoadherent layer, and an optional thermoplastic adhesive layer.

In the preferred embodiment, the cover sheet may be composed of any suitable flexible sheet material which is dimensionally stable when undergoing the herein specified lamination and peeling processes. That is, it should have substantially no change in dimensions under heating in the range of from about 60° C. to about 120° C. during lamination. They may be transparent or non-transparent as required by the inventive method. In one embodiment of the invention it must be transparent to the actinic radiation to which the color layer and photoadhering layer are sensitive. A preferred material is polyethylene terephthalate. In the preferred embodiment, it has a thickness of from about 1 to about 10 mils, a more preferred thickness is from about 2 to about 5 mils and most preferably from about 2 to about 3 mils. Suitable films nonexclusively include Melinex 054, 504, 505, and 582 films available from ICI, and Hostaphan 4400, 4500, and 4540 films available from Hoechst Celanese Corporation. The surface of the support may be smooth or it may be provided with a matte texture as with Melinex 475 film. A smooth surface is preferred because a rough surface scatters actinic radiation and thereby reduces the resolution capability of the photosensitive element.

On the cover sheet is a crosslinked layer, which comprises a polymer having phenolic groups. The phenolic polymer can comprise, for example, a novolak (cresol-formaldehyde resin), polyhydroxystyrene homo- and co-polymer, or acrylic polymer containing phenolic groups etc. Crosslinking of the polymer can be achieved, for example, by the use of polyisocyanates, melamine-formaldehyde resins, urea-formaldehyde resins, epoxy resins, aziridine resins, acrylic monomers under suitable conditions of heat and/or light, etc. The crosslinked phenolic layer is applied from a solvent coating composition onto the cover sheet and should be insoluble in solvents used to coat the subsequent layer. Useful solvents include organic solvents as well as water.

A color layer is then applied to the crosslinked phenolic layer. It comprises a colorant, a binder, an optional photoinitiator and a polymerizable component which may be an ethylenically unsaturated monomer, polymer or oligomer having at least one and preferably more than one unsaturated groups. The color layer may be formed from a composition containing all of these components, or more preferably, the color layer is formed by coating an admixture of a binder and colorant onto the phenolic layer and the photoinitiator and polymerizable component diffuse into the color layer from a subsequently applied photoadherent layer.

The polymerizable component in the color layer and in the photoadhering layer preferably comprise addition polymerizable, non-gaseous (boiling temperature above 100° C. at normal atmospheric pressure), ethylenically-unsaturated compounds containing at least one and preferably at least two terminal ethylenically unsaturated groups, and being capable of forming a high molecular weight polymer by free radical initiated, chain propagating addition polymerization. The most preferred compounds are acrylate or methacrylate monomers as are well known in the art. Suitable polymerizable monomers nonexclusively include triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, trimethylol propane triacrylate, trimethylol propane trimethacrylate, di-pentaerythritol monohydroxypentaacrylate, pentaerythritol triacrylate, bisphenol-A-ethoxylate dimethacrylate, trimethylolpropane ethoxylate triacrylate, trimethylolpropane propoxylate triacrylate, and bisphenol A diepoxide dimethacrylate. The monomers in the color and photoadhering layers can be the same or different.

The optional photoinitiator component used in the color layer and/or photoadhering layer includes any compound which liberate free radicals on stimulation by actinic radiation. Preferred photoinitiators nonexclusively include quinoxaline compounds as described in U.S. Pat. No. 3,765,898; the vicinal polyketaldonyl compounds in U.S. Pat. No. 2,367,660; the alpha-carbonyls in U.S. Pat. Nos. 2,367,661 and 2,367,670; the acyloin ethers in U.S. Pat. No. 2,448,828; the triarylimidazolyl dimers in U.S. Pat. No. 3,479,185; the alpha-hydrocarbon substituted aromatic acyloins in U.S. Pat. No. 2,722,512; polynuclear quinones in U.S. Pat. Nos. 2,951,758 and 3,046,127; and s-triazines in U.S. Pat. Nos. 3,987,037 and 4,189,323. The most preferred photoinitiators include 2,3-di(4-methoxyphenyl)quinoxaline, 9-phenylacridine, 2-biphenyl-4,6-bis-trichloromethyl-5- triazine, bis(2,4,5-triphenyl)imidazole, bis-trichloromethyl-s-triazines, thioxanthones, acetophenones and acyl phosphine oxides, and the derivatives of each of these. For this invention, the term derivatives means that the compound may have pendant groups provided they do not prevent the compound from effecting photoinitiation. The photoinitiator used in the color and/or photoadhering layer may be the same or different.

The color layer also contains a binder or binding resin which not only determines the hardness and/or flexibility of the coating but is also used to control the dry development. Binding resins found suitable for the color layer are polyvinyl acetates, styrene/maleic anhydride copolymers and their half esters; acrylic polymers and copolymers; polyamides; polyvinyl pyrrolidones; cellulose and its derivatives; phenolic resins; and the like. The most preferred binding resins are polyvinyl acetates and acetals, such as UCAR resins available from Union Carbide, and polyvinyl formal, polyvinyl butyral and polyvinyl propional.

The color layer contains a colorant which may be a dye or a pigment to provide color to the image areas. Preferred colorants for this invention are pigments rather than dyes. Light fast colorants are preferred. The pigments are typically dispersed with an organic binder in an organic solvent or mixture of organic solvents. The pigments may be organic or inorganic. They are ground to a small enough particle size to duplicate the particle size and color of equivalent inks. The median diameter is generally less than 1 micrometer. Nonexclusive examples of colorants usable in the present invention are as follows: Permanent Yellow G (C.I. 21095), Permanent Yellow GR (C.I. 21100), Permanent Yellow DHG (C.I. 21090), Permanent Rubine L6B (C.I. 15850:1), Permanent Pink F3B (C.I. 12433), Hostaperm Pink E (73915), Hostaperm Red Violet ER (C.I. 46500), Permanent Carmine FBB (12485), Hostaperm Blue B2G (C.I. 74160), Hostaperm Blue A2R (C.I. 74160), and Printex 25. Most of these are products of Hoechst AG. They can be used separately or blended for a desired color. Dyes may be included in the color layer to spectrally sensitize the photoinitiator, such as described in U.S. Pat. Nos. 4,282,309 and 4,454,218, and European Patent Applications 0,179,448 and 0,211,615.

In the practice of the present invention, the photoinitiator component is preferably present in the color layer in an amount ranging from about 0.01 to about 20% based on the weight of the solids in the layer. A more preferred range is from about 0.1 to about 15%, most preferably from about 1 to about 10%.

In a preferred embodiment of the present invention, the colorant component is present in an amount sufficient to uniformly color the color layer. It is preferably present in an amount ranging from about 5 to about 50% based on the weight of the solids in the color layer. A more preferred range is from about 8 to about 40%.

In the practice of the of the present invention, the binder component is preferably present in the color layer in an amount sufficient to bind the components in a uniform mixture and a uniform film when it is coated on a substrate. It is preferably present in an amount ranging from about 10 to about 90% based on the weight of the solids in the color layer. A more preferred range is from about 20 to about 80%.

In the preferred embodiments, the polymerizable component is present in the color layer in an amount of from about 1 to about 60% by weight of the total solids in the color layer, more preferably from about 5% to about 50%.

Other ingredients which may be present in the color layer may include thermal polymerization inhibitors, tackifiers, oligomers, residual solvents, surfactants, inert fillers, antihalation agents, hydrogen atom donors, photoactivators, and optical brightening agents. A plasticizer may also be included in the color or photoadhering layer of this invention to prevent coating brittleness and to keep the composition pliable if desired. Suitable plasticizers include dibutylphthalate, triarylphosphate and substituted analogs thereof and preferably dioctylphthalate. The color layer is applied from a solvent coating composition to the crosslinked phenolic layer and dried. Organic solvents are preferred for the color layer because of the diverse solubility characteristics of the various components. Typical solvents nonexclusively include methyl ethyl ketone, 2-methoxyethanol, 1-methoxy-2-propanol, 4-hydroxy-4-methyl-2-pentanone, tetrahydrofuran, diacetone alcohol, and gamma-butyrolactone. In the preferred embodiment the dry color layer has a coating weight range of from about 0.1 to about 5 g/m$^2$, preferably from about 0.2 to about 2 g/m$^2$ and the crosslinked phenolic layer has a coating weight range of from about 0.1 to about 5 g/m$^2$, preferably from about 0.4 to 2.0 g/m$^2$.

Adhered to the color layer is the photoadhering layer. The photoadhering layer comprises a photocrosslinkable polymer having ethylenically unsaturated, photocrosslinkable groups and a molecular weight greater than about 3,000, a photopolymerizable monomer having at least one ethylenically unsaturated group, and an optional photoinitiator. At least one of either the color layer or the photoadhering layer contains a photoinitiator.

The optional photoinitiator for the photoadhering layer may comprise any of the photoinitiators described above as useful for the color layer. In the practice of the present invention, the photoinitiator component is preferably present in the photoadhering layer in an amount ranging from about 1 to about 20% based on the weight of the solids in the layer. A preferred range is from about 2 to about 15%, more preferably from about 3 to about 10%. The ethylenically unsaturated monomer having at least one unsaturated group may comprise the same materials listed above as useful for the color layer. The monomer is preferably present in the photoadhering layer in an amount ranging from about 5 to about 50% based on the weight of the solids in the layer. A preferred range is from about 10% to about 45%, more preferably from about 15 to about 40%.

The photoadhering layer preferably also comprises a photocrosslinkable polymer. Suitable photocrosslinkable polymers nonexclusively include a urethane adduct of polyvinyl butyral or other acetal resins containing hydroxy groups and isocyanatoethyl methacrylate, or reaction product of hydroxy-containing acetal resins with methacrylic anhydride, acrylic acid, acryloyl chloride, etc. Such a polymer has ethylenically unsaturated, photocrosslinkable groups and a molecular weight greater than about 3,000 and preferably from about 50,000 to about 200,000. Preferred photopolymerizable polymers comprise random units of a)

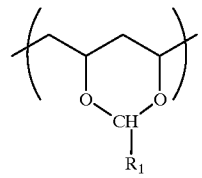

b) 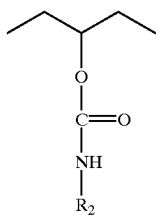

c) 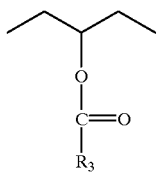

d) 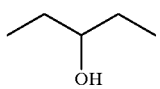

wherein
a=50–99%
b=1=30%
c=0–30%
d=0–50% and a+b+c+d=100%

$R_1$ is a hydrogen atom or a substituted or unsubstituted alkyl radical having from 1 to about 6 carbon atoms, or a substituted or unsubstituted aryl radical;

$R_2$ is

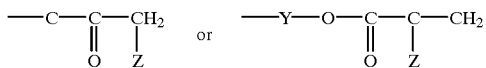

wherein Z is hydrogen or methyl and Y is a substituted or unsubstituted alkyl group having 1 to about 4 carbon atoms; and $R_3$ is an alkyl radical having from 1 to about 4 carbon atoms. As used herein the term "substituted" means having a pendant group which does not detrimentally affect the photosensitive property of the polymer.

A preferred photocrosslinkable polymer is the reaction product of a polyvinyl acetal such as a polyvinyl butyral with a (meth)acrylated monoisocyanate such as acryloyl isocyanate, methacryloyl isocyanate or isocyanatoethyl methacrylate. Such a reaction may take place in an organic solvent unreactive with the isocyanate, such as tetrahydrofuran, methyl ethyl ketone or ethyl acetate. The reaction may optionally be catalyzed by such known catalysts as dibutyltin dilaureate. Acrylic polymers containing hydroxy groups can also be used with all the above (meth) acrylic groups-containing reagents, as can polyvinyl alcohols and their copolymers, phenolic resins, etc. Other reactive groups on polymers which can be (meth)acrylated nonexclusively include: amino, carboxyl, epoxy, etc. The (meth)acrylated polyvinyl acetal polymers are preferred. The photocrosslinkable polymer component is preferably present in the photoadhering layer in an amount of from about 3 to about 50%, more preferably from about 5% to about 40% and most preferably from about 10% to about 30% by weight of the total solids in the photoadhering layer.

The photoadherent layer may optionally contain such other desired components as uv absorbers such as Uvinul D-50 available from GAF, antistatic compositions such as Gafac and Gafstat available from GAF, optical brighteners, inert fillers, thermal polymerizable inhibitors, residual solvents, surfactants, antihalation agents, hydrogen atom donors, tackifiers, and plasticizers such as Resoflex R-296, available from Cambridge Industries.

To form the photoadhering layer, the components may be dissolved in a solvent or mixture of solvents to facilitate application of the composition to the substrate. Suitable solvents for this purpose nonexclusively include water, tetrahydrofuran, n-butyl acetate, isobutyl isobutyrate, glycol ethers such as propylene glycol monomethyl ether and methyl cellosolve, alcohols such as ethanol and n-propanol and ketones such as methyl ethyl ketone. In general, the solvent composition is evaporated from the coating composition once it is applied to an appropriate substrate. However, some insignificant amount of solvent may remain as residue. In addition, the monomer from the photoadhering layer tends to diffuse into the color layer during overcoating process, so one way of providing the color layer with the monomer is not to include it in the coating solution of the color layer, but let it migrate there from the photoadhering layer during coating and drying process, or during lamination of the layers. This process of monomer migration via diffusion is known to those skilled in the art of creating multilayer imaging systems. According to the present invention, it is important that the monomer be present in the color layer when the element is exposed to actinic radiation, regardless of the way it became the part of the color layer. In the preferred embodiment, the photoadhering layer has a coating weight between about 2 and about 20 g/m$^2$. The most preferred weight is from about 3 to about 10 g/m$^2$.

The element next comprises an optional thermoplastic adhesive layer coated directly on the photoadhering layer. Preferred adhesive layers comprise thermoplastic resins coatable out of water. Such adhesives nonexclusively include Carboset acrylic resins, polyvinyl acetate/crotonic acid copolymers, polyvinyl pyrrolidone/polyvinyl acetate copolymers, polyvinyl acetate emulsions, styrene/maleic anhydride copolymers, urethane polymers, etc. The adhesive layer should be coated from a solvent which does not disturb the photoadhering layer underneath. Water is the preferred solvent. The adhesive layer may comprise a plasticizer which may be present in an amount of up to about 0% by weight and a uv absorber up to about 10% by weight. The coating weight of the layer should be from about 2 to about 20 g/m$^2$, more preferably from about 5 to about 15 g/m$^2$, and most preferably from about 6 to about 10 g/m$^2$. In place of direct overcoating, one can assemble the hereinbefore described photosensitive element by hot-laminating the layers to each other, as is well known in the art. The adhesive layer should be transferable to a development sheet when laminated with pressure and heat in a temperature range of from about 50° C. to about 180° C., preferably from about 60° C. to about 120° C., more preferably from about 60° C. to about 100° C.

In the most preferred embodiment, the adhesive layer is present on the photoadhesive layer during the imagewise exposing. However, the adhesive layer may be omitted if the photoadhering layer is prepared from components having sufficient adhesion to the receiver sheet. In another embodiment, the adhesive layer is absent from the photoadhesive layer during the imagewise exposing and is applied to the photoadhesive layer after the imagewise exposing. In yet another embodiment, the photosensitive element is laminated to the receive sheet via an adhesive layer on the receiver sheet.

The element is then imagewise exposed through either the cover sheet or the photoadhering layer by means well known in the art. Such exposure may be conducted by exposure to actinic radiation from a light source through a conventional halftone negative color separation under vacuum frame conditions. Mercury vapor discharge lamps are preferred over metal halide lamps. Other radiation sources, such as carbon arc, pulsed xenon, and lasers, may also be used. Light absorbing filters may be used to reduce light scattering in the materials.

Next, the cover sheet bearing the latent negative image is laminated to a receiver sheet comprising a substrate and an optional adhering layer on the substrate.

This is done by contacting the photoadhering layer, or the adhesive layer if it is present, to the receiver sheet and laminating using heat and pressure. Lamination of the photosensitive element to the receiver sheet may be conducted by putting either the photoadhering layer or the optional adhesive layer in contact with the receiver sheet and then introducing the materials into the nip of a pair of heated laminating rollers under suitable pressure. Suitable laminating temperatures usually range from about 60° C. to about 120° C., preferably from about 70° C. to about 100° C.

Receiver sheets comprise a substrate optionally coated with an adhering layer coated directly on the substrate. The substrate may comprise the same or similar material as a development sheet or a cover sheet. Thus includes virtually any dimensionally stable support which can withstand the laminating and dry development processes. White plastic sheets, such as adhesion pretreated polyester Melinex 3020 film available from ICI, are useful for this purpose. Plastic coated paper sheets, such as polyethylene coated paper available from Schoeller, may also be used. Other bases may include wood, glass, metal, paper and the like. Preferred adhering layers include those listed above.

The cover sheet and crosslinked layer are subsequently peeled apart from the receiver sheet, leaving the colored negative image, photoadhering layer and optional adhesive layer on the receiver sheet. A negative image remains attached to the receiver sheet by stripping the transparent cover sheet from the receiver sheet at room temperature with a steady, continuous motion. The preferred peel angle relative to the peel direction is greater than 90°. The delamination leaves the photoexposed areas of the color layer attached to the photoadhering layer, which in its entirety is transferred to the receiver sheet via the optional adhesive layer. The nonexposed areas of the color layer remain on the crosslinked phenolic layer on the cover sheet. This entire process, beginning with a new element with a different colored layer, is preferably repeated at least once to transfer at least one more negative image to the negative image previously produced on the receiver sheet. In a full color proofing image, four distinct colored images are formed on a receiver sheet, namely magenta, cyan, yellow, and black. When the images are superimposed upon each other, a simulated full color reproduction results. In order to attain a multicolored image, multiple negative images produced from the above described photosensitive elements are laminated onto the first produced colored image. The final four color proof may be given a uniform, blanket exposure to photoharden the exposed, colored areas on the receiver base. A protective layer may also be laminated on top of the last dry developed layer. A matte finish of the final image may be obtained by embossing the shiny, top surface of the image with a matte material, such as Melinex 377 film available from ICI. This is done by laminating together the final image and matte material and peeling the matte material away.

The following nonlimiting examples serve to illustrate the invention.

EXAMPLES

Photoadhering Layer Solution

To prepare the polymer with ethylenically unsaturated groups useful in photoadhering layer, 50 g of Butvar 79 polyvinyl butyral resin from Monsanto containing free hydroxyl groups (10.5–13%, expressed as % polyvinyl alcohol) was placed in 200 g of n-butyl acetate with stirring, at room temperature. To this solution, there were added 20 g of isocyanatoethyl methacrylate (Monomer, Polymer & Dajac Laboratories, Inc.), along with 0.05 g of dibutyltin dilaureate as catalyst. The mixture was left stirring overnight, and after that time no isocyanate band was seen in the IR spectrum of the polymer. Thus, a polymer containing methacrylate groups was created. To 10 g of the above stock solution, there were added 0.38 g of Sartomer 399 Dipentaerythritol pentaacrylate (available from the Sartoma Co.), as monomer, and 0.1 g of 2-biphenyl-4,6-bis-trichloromethyl-s-triazine as initiator, completing the photoadhering layer formulation.

Phenolic Layer Solution

Methyl Ethyl Ketone (MEK)—47 g

Dowanol PM—47 g

Poly-p-hydroxystyrene (6,200 MW, available from Hoechst Celanese Corporation)—3 g Melamine-formaldehyde resin (Cymel 303, Cyanamid)—1 g p-Toluene sulfonic acid—0.2 g This solution was coated on Melinex 505, 2 mil polyester (PET) available from ICI (cover sheet) to coating weight of 0.5 g/m². The layer subsequently crosslinked upon drying in the oven at 110° C. for 2 minutes.

| Color Layer Solutions: | | | | |
|---|---|---|---|---|
| Ingredient - Color Layer | Cyan | Yellow | Magenta | Black |
| Tetrahydrofuran | 200 | 200 | 200 | 200 |
| 4-hydroxy-4-methyl pentanone | 150 | 150 | 150 | 150 |
| 1-methoxy-2-propanol | 444 | 465 | 489 | 490 |
| Formvar 12/85 resin | 12 | 13 | 15 | 18 |
| Sartomer 369 (Sartomer Co, Hydroxyethyl isocyanurate triacrylate monomer) | 10 | 12 | 16 | 15 |
| Hostaperm B2G | 14 | — | — | — |
| Permanent Yellow GR | — | 14 | — | — |
| Permanent Red FBB | — | — | 24 | — |
| Printex 25 | — | — | — | 24 |

The pigments were dispersed in Formvar 12/85 and solvents. The color solutions were coated on the crosslinked phenolic layer with a Meyer rod #12 and dried. The coating weight was 0.8 g/m². The color layer composition was then overcoated with the above photoadhering layer solution with a Meyer rod #24 and dried. The coating weight was 6.8 g/m².

Adhesive Layer Solution

The adhesive solution was Carboset XL-37 aqueous acrylic dispersion (available from B.F. Goodrich). It was coated on the photoadhering layer with a Meyer rod #15 and dried. The coating weight was 6 g/m².

COMPARATIVE EXAMPLE 1

A sheet of Cyan film prepared above was cut into two parts. The first part was laminated, using heat and pressure, to Pressmatch Publication Receiver Base available from Agfa Corporation, with the adhesive layer facing the base. It was then exposed through a photomask through the clear PET support to the output of Olec L-1261 Exposure Unit's 5K light source set at low intensity, in a series of exposures of different length, and the clear PET support was peeled away. The best resolution obtained was only 10–95% dots on a 150 l/inch screen ruling.

EXAMPLE 1

A second part of the sheet from Comparative Example 1 was laid on the Pressmatch Publication Receiver Base available from Agfa Corporation with the adhesive layer facing the base, but was not laminated. It was then exposed through a photomask through the clear PET support to the output of Olec L-1261 Exposure Unit's 5K light source set at low intensity, in a series of exposures of different length. It was then laminated to the base, and the clear PET support was peeled away. The best resolution obtained was 2–97% dots on a 150 l/inch screen ruling, significantly better than in the Comparative example 1.

COMPARATIVE EXAMPLE 2

A sheet of black film described above was cut into two parts. The first part was laminated, using heat and pressure, to Pressmatcb Publication Receiver Base available from Agfa Corporation, with the adhesive layer facing the base. It was then exposed through a photomask through the clear PET support to the output of a Theimer Exposure Unit's 2K light source, in a series of exposures of different length, and the clear PET support was peeled away. The best resolution obtained was only 5–95% dots on a 150 l/inch screen ruling.

EXAMPLE 2

A second part of the sheet from Comparative Example 2 was laid on the Pressmatch Publication Receiver Base available from Agfa Corporation with the adhesive layer facing the base, but was not laminated. It was then exposed through a photomask through the clear PET support to the output of Theimer Exposure Unit's 2K lamp, in a series of exposures of different length. It was then laminated to the base, and the clear PET support was peeled away. The best resolution obtained was 3–97% dots on a 150 l/inch screen ruling, significantly better than in the Comparative example 2.

COMPARATIVE EXAMPLE 3

A sheet of black film described above was cut into two parts. The first part was laminated, using heat and pressure, to Pressmatch Publication Receiver Base available from Agfa Corporation, with the adhesive layer facing the base. It was then exposed through a photomask through the clear PET support to the output of a Nuarc Exposure Unit's 1K light source, in a series of exposures of different length, and the clear PET support was peeled away. The best resolution obtained was only 5–95% dots on a 150 l/inch screen ruling.

EXAMPLE 3

A second part of the sheet from Comparative Example 3 was laid on the Pressmatch Publication Receiver Base available from Agfa Corporation with the adhesive layer facing the base, but was not laminated. It was then exposed through a photomask through the clear PET support to the output of Nuarc Exposure Unit's 1K light source, in a series of exposures of different length. It was then laminated to the base, and the clear PET support was peeled away. The best resolution obtained was 3–98% dots on a 150 l/inch screen ruling, significantly better than in the Comparative example 3.

As can be seen from these examples, a process wherein the photosensitive element is first exposed and then laminated unexpectedly provides much better resolution than the same element which is first laminated to the receiver and then exposed.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A method for producing a negative image which comprises:
   (A) providing a photosensitive element which comprises, in order from top to bottom
      (i) a strippable, transparent cover sheet;
      (ii) a crosslinked layer, which comprises a polymer having phenolic groups;
      (iii) a color layer, which comprises an organic binder, a photopolymerizable monomer, a colorant, and optionally, a photoinitiator, wherein the binder is present in sufficient amount to bind the color layer components into a uniform film, wherein the optional photoinitiator, when present, is present in sufficient amount to initiate polymerization of the photopolymerizable monomer, wherein the photopolymerizable monomer is present in sufficient amount to provide image differentiation when the element is imagewise exposed to actinic radiation and wherein the colorant is present in an amount sufficient to uniformly color the color layer;
      (iv) a photoadhering layer, which comprises a photocrosslinkable polymer having ethylenically unsaturated, photocrosslinkable groups and a molecular weight greater than about 3,000, a photopolymerizable monomer having at least one ethylenically unsaturated group, and an optional photoinitiator, wherein the optional photoinitiator, when present, is present in sufficient amount to initiate polymerization of the photopolymerizable monomer and the crosslinking of the photocrosslinkable polymer and wherein at least one of either the color layer or the photoadhering layer contains a photoinitiator; and
      (v) an optional thermoplastic adhesive layer;
   (B) imagewise exposing the color layer and the photoadhering layer through the cover sheet to actinic radiation, thereby producing a latent negative image;
   (C) thereafter laminating the photosensitive element via the photoadhering layer and optional thermoplastic adhesive layer to a receiver sheet;
   (D) peeling apart the receiver sheet and the transparent cover sheet with the crosslinked phenolic layer, retaining unexposed areas of the color layer on the crosslinked phenolic layer of the cover sheet, and transferring the exposed areas of the color layer onto the receiver sheet via the photoadhering layer and optional adhesive layer, to thereby form a colored negative image on the receiver sheet; and (E) optionally repeating steps (A) through (D) at least once wherein a latent negative image from another photosensitive element having at least one different colorant is transferred onto the negative image previously produced on the receiver sheet.

2. The method of claim 1 wherein the adhesive layer is absent from the photoadhesive layer during the imagewise exposing.

3. The method of claim 1 wherein the adhesive layer is absent from the photoadhesive layer during the imagewise exposing and the adhesive layer is applied to the photoadhesive layer after the imagewise exposing.

4. The method of claim 1 wherein the photosensitive element is laminated to the receive sheet via an adhesive layer on the receiver sheet.

5. The method of claim 1 wherein the adhesive layer is present on the photoadhesive layer during the imagewise exposing.

6. The method of claim 1 wherein steps (A) through (D) are repeated at least once wherein a latent negative image from another photosensitive element having at least one different colorant is transferred onto the negative image previously produced on the receiver sheet.

7. The method of claim 1 further comprising the subsequent step (F) of overall exposing the negative image on the receiver sheet to actinic radiation.

8. The method of claim 1 wherein the polymer having ethylenically unsaturated, photocrosslinkable groups and a molecular weight greater than 3,000 is present in the photoadhering layer in an amount of from about 10 to about 30 weight percent based on the weight of the non-solvent parts of the photoadherent layer.

9. The method of claim 1 wherein both the color layer and the photoadhering layer contain a photoinitiator.

10. The method of claim 1, wherein the photopolymerizable monomer is delivered to the color layer by interlayer diffusion during assembly of the photosensitive element.

11. The method of claim 1 wherein the polymerizable monomer comprises one or more monomers selected from the group consisting of triethylene glycol dimethacrylate, tripropylene glycol diacrylate, tetraethylene glycol dimethacrylate, diethylene glycol dimethacrylate, 1,4-butanediol diacrylate, 1,6-hexanediol dimethacrylate, pentaerythritol tetraacrylate, di-pentaerythritol pentaacrylate, trimethylol propane triacrylate, trimethylol propane trimethacrylate, pentaerythritol triacrylate, bisphenol A ethoxylate dimethacrylate, trimethylolpropane ethoxylate triacrylate, trimethylolpropane propoxylate triacrylate, bisphenol A diepoxide dimethacrylate and bisphenol A.

12. The method of claim 1 wherein the photoinitiator comprises one or more photoinitiators selected from the group consisting of 2,3-di(4-methoxyphenyl)quinoxaline, 9-phenylacridine, 2-biphenyl-4,6-bis-trichloromethyl-5-triazine, bis(2,4,5-triphenyl)imidazole, bis-trichloromethyl-s-triazine, acetophenones, thioxanthones, acyl phosphine oxides, and their derivatives.

13. The method of claim 1 wherein the color layer comprises one or more binding resins selected from the group consisting of styrene/maleic anhydride copolymers and their half esters; acrylic polymers and copolymers; polyamides; polyvinyl pyrrolidones; cellulosic resins; phenolic resins; polyvinyl acetals, polyvinyl acetates and their copolymers.

14. The method of claim 1 wherein the receiver sheet comprises paper, coated paper, or a polymeric film.

15. The method of claim 1 wherein the cover sheet comprises polyethylene terephthalate; the crosslinked layer comprises a crosslinked polyhydroxystyrene homopolymer or co-polymer; the color layer comprises a urethane adduct of trimethylhexamethylene diisocyanate with 2-hydroxyethyl-4,6-bis-acryloxyethyl isocyanurate; the photoadhering layer comprises dipentaerythritol pentaacrylate and 2-biphenyl-4,6-bis-trichloromethyl-s-triazine and the receiver sheet substrate comprises paper or a white polymeric film.

16. The method of claim 1 wherein the phenolic polymer comprises at least one material selected from the group consisting of a novolaks, polyhydroxystyrene homopolymers, polyhydroxystyrene copolymers, and acrylic polymers containing phenolic groups, crosslinked by at least one material selected from the group consisting of polyisocyanates, melamine-formaldehyde resins, urea-formaldehyde resins, epoxy resins, aziridine resins, and acrylic monomers under suitable conditions of heat and/or light.

17. The method of claim 1 wherein the photoinitiator component is present in the color layer in an amount ranging from about 0.01 to about 20% based on the weight of the solids in the layer; the colorant component is present in the color layer in an amount of from about 5 to about 50% based on the weight of the solids in the color layer; the binder component is present in the color layer in an amount of from about 10 to about 90% based on the weight of the solids in the color layer and the polymerizable component is present in the color layer in an amount of from about 1 to about 60% by weight of the total solids in the color layer.

18. The method of claim 1 wherein the photoinitiator is present in the photoadhering layer in an amount of from about 1 to about 20% based on the weight of the solids in the layer, the ethylenically unsaturated monomer is present in the photoadhering layer in an amount ranging from about 5 to about 50% based on the weight of the solids in the layer and the photocrosslinkable polymer is present in the photoadhering layer in an amount of from about 3 to about 50% based on the weight of the solids in the layer.

19. The method of claim 1 wherein the photocrosslinkable polymer is the reaction product of a polyvinyl acetal with a (meth)acrylated monoisocyanate.

* * * * *